(12) United States Patent
Hung et al.

(10) Patent No.: US 11,532,569 B2
(45) Date of Patent: Dec. 20, 2022

(54) METHOD FOR MANUFACTURING SEMICONDUCTOR PACKAGE STRUCTURE

(71) Applicant: TAIWAN SEMICONDUCTOR MANUFACTURING COMPANY LTD., Hsinchu (TW)

(72) Inventors: Jui-Pin Hung, Hsinchu (TW); Feng-Cheng Hsu, New Taipei (TW); Shuo-Mao Chen, New Taipei (TW); Shin-Puu Jeng, Hsinchu (TW); De-Dui Marvin Liao, Hsin-Chu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 168 days.

(21) Appl. No.: 16/859,037

(22) Filed: Apr. 27, 2020

(65) Prior Publication Data
US 2020/0258849 A1   Aug. 13, 2020

Related U.S. Application Data

(63) Continuation of application No. 16/004,600, filed on Jun. 11, 2018, now Pat. No. 10,636,747, which is a (Continued)

(51) Int. Cl.
*H01L 23/00* (2006.01)
*H01L 21/48* (2006.01)
(Continued)

(52) U.S. Cl.
CPC .......... *H01L 23/562* (2013.01); *G06F 16/24* (2019.01); *G06F 16/435* (2019.01);
(Continued)

(58) Field of Classification Search
CPC .............. H01L 21/4853; H01L 21/4857; H01L 21/486; H01L 21/565; H01L 21/6835; H01L 21/78; H01L 23/3114
See application file for complete search history.

(56) References Cited

U.S. PATENT DOCUMENTS

2008/0017968 A1   1/2008   Choi et al.
2009/0261466 A1   10/2009  Pagaila et al.
(Continued)

FOREIGN PATENT DOCUMENTS

CN   103715166 A   4/2014
CN   103839894 A   6/2014
(Continued)

OTHER PUBLICATIONS

Office Action and Search Report dated Dec. 23, 2020 issued by Taiwan Intellectual Property Office for counterpart application No. 106111706.
(Continued)

*Primary Examiner* — Walter H Swanson
(74) *Attorney, Agent, or Firm* — WAPT; Anthony King

(57) ABSTRACT

A semiconductor package structure includes a first redistribution layer, a second redistribution layer and an interconnecting structure. The first redistribution layer has a first surface and a second surface opposite to each other. The second redistribution layer is disposed over the first surface of the first redistribution layer, wherein the second redistribution layer has a third surface and a fourth surface opposite to each other, and the third surface facing the first surface. The interconnecting structure is disposed between and electrically connected to the first redistribution layer and the second redistribution layer, wherein the interconnecting structure comprises a conductive post and a conductive bump stacked to each other.

20 Claims, 19 Drawing Sheets

Related U.S. Application Data continuation of application No. 15/371,869, filed on Dec. 7, 2016, now Pat. No. 9,997,471.

(60) Provisional application No. 62/366,295, filed on Jul. 25, 2016.

(51) Int. Cl.

| | |
|---|---|
| *H01L 21/56* | (2006.01) |
| *H01L 21/78* | (2006.01) |
| *H01L 23/31* | (2006.01) |
| *H01L 23/498* | (2006.01) |
| *H01L 25/10* | (2006.01) |
| *H01L 25/00* | (2006.01) |
| *H01L 23/538* | (2006.01) |
| *H01L 25/03* | (2006.01) |
| *H01L 21/683* | (2006.01) |
| *G06F 16/435* | (2019.01) |
| *G06F 16/9535* | (2019.01) |
| *G06F 16/24* | (2019.01) |
| *G06Q 50/00* | (2012.01) |
| *H01L 25/16* | (2006.01) |
| *H01L 25/18* | (2006.01) |
| *G06Q 99/00* | (2006.01) |

(52) U.S. Cl.
CPC ......... *G06F 16/9535* (2019.01); *G06Q 50/01* (2013.01); *H01L 21/486* (2013.01); *H01L 21/4853* (2013.01); *H01L 21/4857* (2013.01); *H01L 21/565* (2013.01); *H01L 21/6835* (2013.01); *H01L 21/78* (2013.01); *H01L 23/3114* (2013.01); *H01L 23/49822* (2013.01); *H01L 23/49838* (2013.01); *H01L 23/5383* (2013.01); *H01L 23/5384* (2013.01); *H01L 23/5389* (2013.01); *H01L 24/00* (2013.01); *H01L 24/16* (2013.01); *H01L 24/97* (2013.01); *H01L 25/03* (2013.01); *H01L 25/105* (2013.01); *H01L 25/50* (2013.01); *G06Q 99/00* (2013.01); *H01L 24/48* (2013.01); *H01L 25/16* (2013.01); *H01L 25/18* (2013.01); *H01L 2221/68331* (2013.01); *H01L 2221/68345* (2013.01); *H01L 2221/68359* (2013.01); *H01L 2224/0401* (2013.01); *H01L 2224/04042* (2013.01); *H01L 2224/16227* (2013.01); *H01L 2224/32145* (2013.01); *H01L 2224/32225* (2013.01); *H01L 2224/48091* (2013.01); *H01L 2224/48227* (2013.01); *H01L 2224/73204* (2013.01); *H01L 2224/73265* (2013.01); *H01L 2224/81* (2013.01); *H01L 2224/81005* (2013.01); *H01L 2224/97* (2013.01); *H01L 2225/0651* (2013.01); *H01L 2225/06568* (2013.01); *H01L 2225/1023* (2013.01); *H01L 2225/1058* (2013.01); *H01L 2225/1088* (2013.01); *H01L 2924/00014* (2013.01); *H01L 2924/1434* (2013.01); *H01L 2924/15192* (2013.01); *H01L 2924/15311* (2013.01); *H01L 2924/15331* (2013.01); *H01L 2924/181* (2013.01); *H01L 2924/19041* (2013.01); *H01L 2924/19042* (2013.01); *H01L 2924/19043* (2013.01); *H01L 2924/19105* (2013.01); *H01L 2924/19106* (2013.01); *H01L 2924/3511* (2013.01)

(56) References Cited

U.S. PATENT DOCUMENTS

| | | | |
|---|---|---|---|
| 2010/0140771 | A1 | 6/2010 | Huang et al. |
| 2011/0129960 | A1 | 6/2011 | Park et al. |
| 2011/0237004 | A1 | 9/2011 | Lee et al. |
| 2012/0093078 | A1 | 4/2012 | Perlman et al. |
| 2013/0093078 | A1 | 4/2013 | Lin et al. |
| 2013/0292831 | A1 | 11/2013 | Liu et al. |
| 2014/0021594 | A1* | 1/2014 | Yew .............. H01L 23/49816 29/846 |
| 2014/0061888 | A1* | 3/2014 | Lin .............. H01L 25/0657 438/118 |
| 2014/0103488 | A1 | 4/2014 | Chen et al. |
| 2015/0179587 | A1 | 6/2015 | Shim et al. |
| 2015/0228580 | A1 | 8/2015 | Chen et al. |
| 2015/0318262 | A1 | 11/2015 | Gu et al. |

FOREIGN PATENT DOCUMENTS

| | | |
|---|---|---|
| CN | 104051390 A | 9/2014 |
| CN | 104051411 A | 9/2014 |
| CN | 105720049 A | 6/2016 |

OTHER PUBLICATIONS

Office Action and Search Report dated Aug. 31, 2020 issued by China National Intellectual Property Administration for counterpart application No. 201710450368.1.

Office Action dated Aug. 31, 2021 issued by the China National Intellectual Property Administration for counterpart application No. 201710450368.1.

Office Action, Cited References and Search Report dated Mar. 19, 2021 issued by the China National Intellectual Property Administration for counterpart application No. 201710450368.1.

\* cited by examiner

METHOD FOR MANUFACTURING SEMICONDUCTOR PACKAGE STRUCTURE

CROSS REFERENCE TO RELATED APPLICATIONS

This application is a continuation of application Ser. No. 16/004,600, filed on Jun. 11, 2018, now allowed, which is a continuation of application Ser. No. 15/371,869, filed on Dec. 7, 2016, now allowed, which claims the benefit of provisional application Ser. No. 62/366,295 filed on Jul. 25, 2016. All of the above-referenced applications are hereby incorporated herein by reference in their entirety.

BACKGROUND

A semiconductor package structure includes plural of active and passive device chips. Active devices such as bipolar and field effect transistors are configured to control the flow of electrical current. Passive devices such as resistors, capacitors and inductors are used to create a relationship between voltage and current necessary to perform a variety of electrical functions. The passive and active devices are electrically connected to form circuits, which enable the semiconductor device to perform high-speed calculations and other useful functions.

With the evolving of semiconductor technologies, semiconductor devices are becoming increasingly smaller. In the meantime, more functions need to be integrated into the semiconductor devices. Accordingly, the semiconductor devices need to have increasingly greater numbers of I/O contact pads packed into smaller areas, and the density of the I/O contact pads rises quickly with time. As a result, the packaging of the semiconductor devices becomes more difficult, which adversely affects the yield of the packaging.

BRIEF DESCRIPTION OF THE DRAWINGS

Aspects of the present disclosure are best understood from the following detailed description when read with the accompanying figures. It is noted that, in accordance with the standard practice in the industry, various structures are not drawn to scale. In fact, the dimensions of the various structures may be arbitrarily increased or reduced for clarity of discussion.

DETAILED DESCRIPTION

Figure 1:
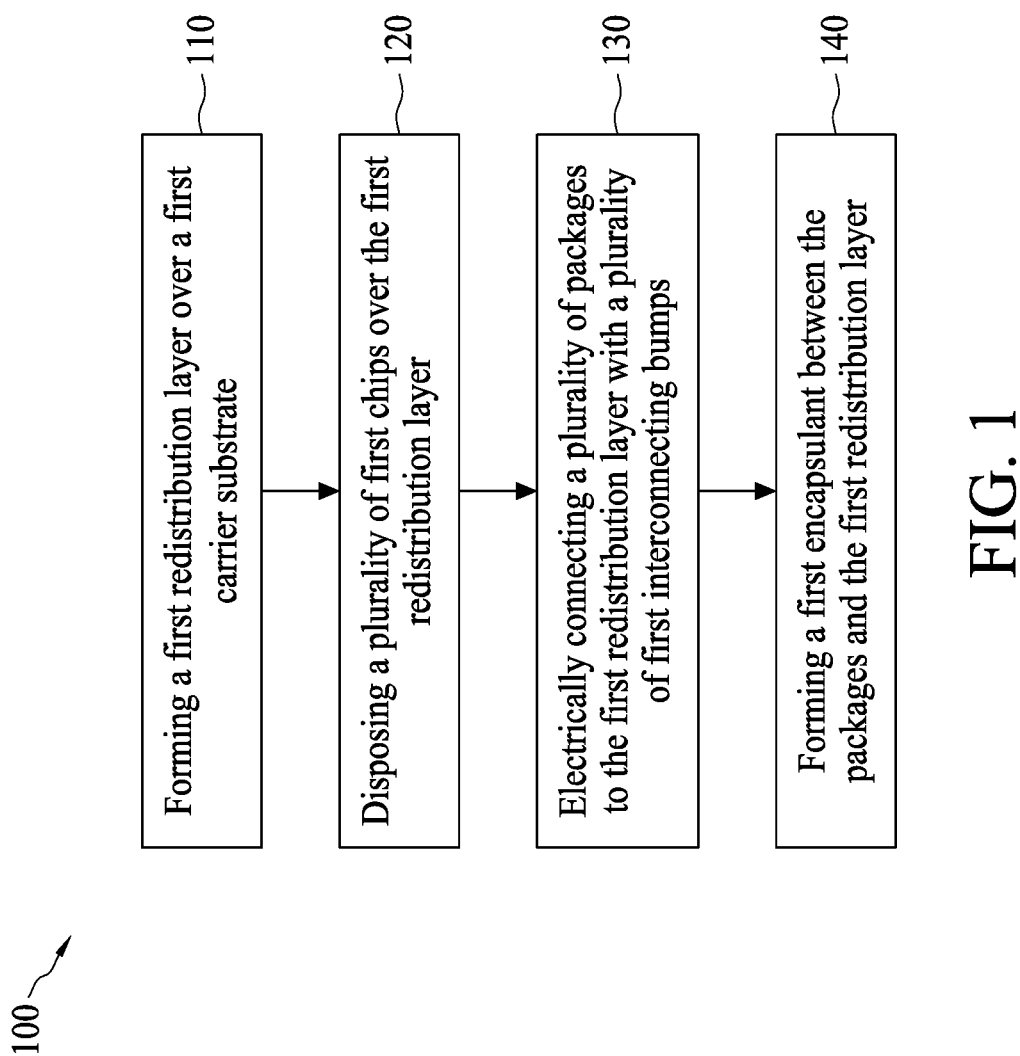
FIG. 1 is a flow chart illustrating a method for manufacturing a semiconductor package structure according to various aspects of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "above", "upper", "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first", "second" and "third" describe various elements, components, regions, layers and/or sections, these elements, components, regions, layers and/or sections should not be limited by these terms. These terms may be only used to distinguish one element, component, region, layer or section from another. The terms such as "first", "second", and "third" when used herein do not imply a sequence or order unless clearly indicated by the context.

As used herein, the term "carrier substrate" or "temporary substrate" refers to a carrier configured as an intermediate substrate for facility of fabrication of overlying layer such as redistribution layer, chip, encapsulant and other structures, or for dicing. The carrier substrate or the temporary substrate provides temporary supporting and fixing functions, and will be removed from the overlying structure.

As used herein, the term "passive device" refers to devices including resistors, capacitors, inductors or a combination thereof.

As used herein, the term "redistribution layer (RDL)" refers to a layer stack formed from at least one conductive pattern and at least one insulation layer, and configured to electrically communicate with two or more devices.

As used herein, the term "interconnecting bump" refers to a conductor configured to electrically interconnecting two conductive structures through its two ends. In one or more embodiments, the interconnecting bump is formed of a low melting point material, which can be formed by low temperature operation. The interconnecting bump is formed prior to formation of the encapsulant which surrounds sidewalls of the interconnecting bump. In one or more embodiments, the interconnecting bump is a solder bump, a solder paste, or the like.

In some embodiments of the present disclosure, the semiconductor package structure includes two or more redistribution layers, and these RDLs are interconnected through solder balls or solder pastes in conjunction with conductive posts embedded in an encapsulant, instead of through via structures penetrating a substrate. The chips are able to be embedded in the encapsulant, which reduces the overall height of the semiconductor package structure, and allows chips with distinct thicknesses to be disposed at the same level.

FIG. 1 is a flow chart illustrating a method for manufacturing a semiconductor package structure according to various aspects of the present disclosure. The method 100 begins with operation 110 in which a first redistribution layer is formed over a first carrier substrate. The method 100 continues with operation 120 in which a plurality of first chips are disposed over the first redistribution layer. The method 100 proceeds with operation 130 in which a plurality of packages with a plurality of first interconnecting bumps are electrically connected to the first redistribution layer. The method 100 proceeds with operation 140 in which a first encapsulant is formed between the packages and the first redistribution layer.

The method 100 is merely an example, and is not intended to limit the present disclosure beyond what is explicitly recited in the claims. Additional operations can be provided before, during, and after the method 100, and some operations described can be replaced, eliminated, or moved around for additional embodiments of the method.

Figure 2A:
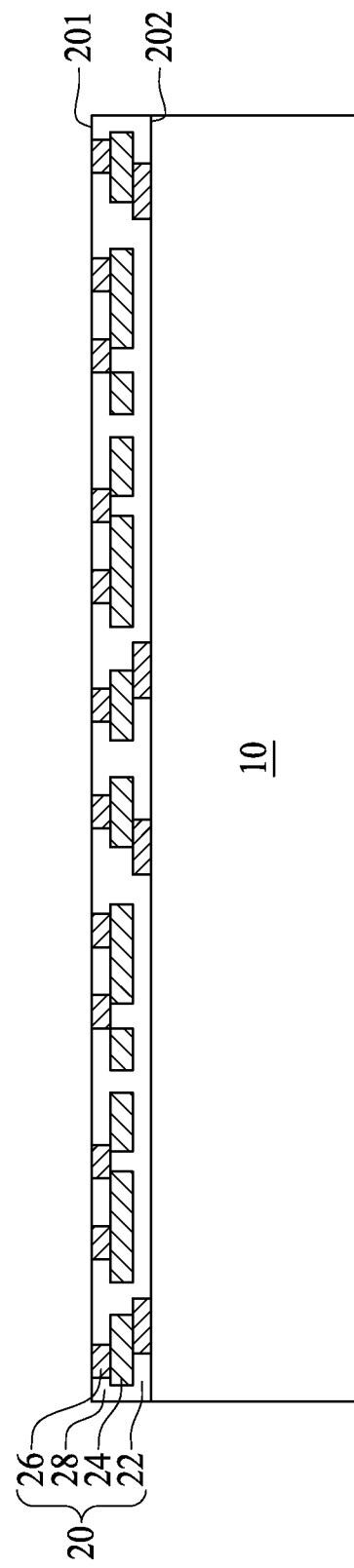
FIGS. 2A, 2B, 2C, 2D, 2E, 2F, 2G, 2H and 2I are cross-sectional views at one of various operations of manufacturing semiconductor package structure according to one or more embodiments of the present disclosure.

FIGS. 2A, 2B, 2C, 2D, 2E, 2F, 2G, 2H and 2I are cross-sectional views at one of various operations of manufacturing semiconductor package structure according to one or more embodiments of the present disclosure. As depicted in FIG. 2A, a first redistribution layer 20 is formed over a first carrier substrate 10. The first carrier substrate 10 is configured as a temporary carrier for forming the first redistribution layer 20, and will be removed subsequently. In one or more embodiments, the first carrier substrate 10 is an insulative substrate such as a glass substrate. The first carrier substrate 10 may include a semiconductor substrate such as a silicon substrate, a conductive substrate such as a metal substrate, or other suitable substrate. The first redistribution layer 20 has a first surface 201 and a second surface 202 opposite to each other. In some embodiments, the second surface 202 of the first redistribution layer 20 faces the first carrier substrate 10. The first redistribution layer 20 is formed by at least one conductive layer and at least one insulation layer, and configured to electrically communicate with two or more devices. In one or more embodiments, the first redistribution layer 20 includes three conductive layers 22, 24, 26 and at least one insulation layer 28 surrounding the conductive layers 22, 24, 26. In some embodiments, the conductive layers 22, 24, 26 include different patterns, and some of the portions are electrically connected. In some embodiments, the conductive layer 22 is exposed from the second surface 202, and the conductive layer 26 is exposed from the first surface 201. In some embodiments, the first redistribution layer 20 is formed by performing several deposition operations, photolithography operations and etching operations. In some embodiments, the material of the conductive layers 22, 24, 26 includes metal such as copper, titanium, the like, or a combination thereof. The material of the at least one insulation layer 24 may include inorganic and/or organic insulation material.

Figure 2B:
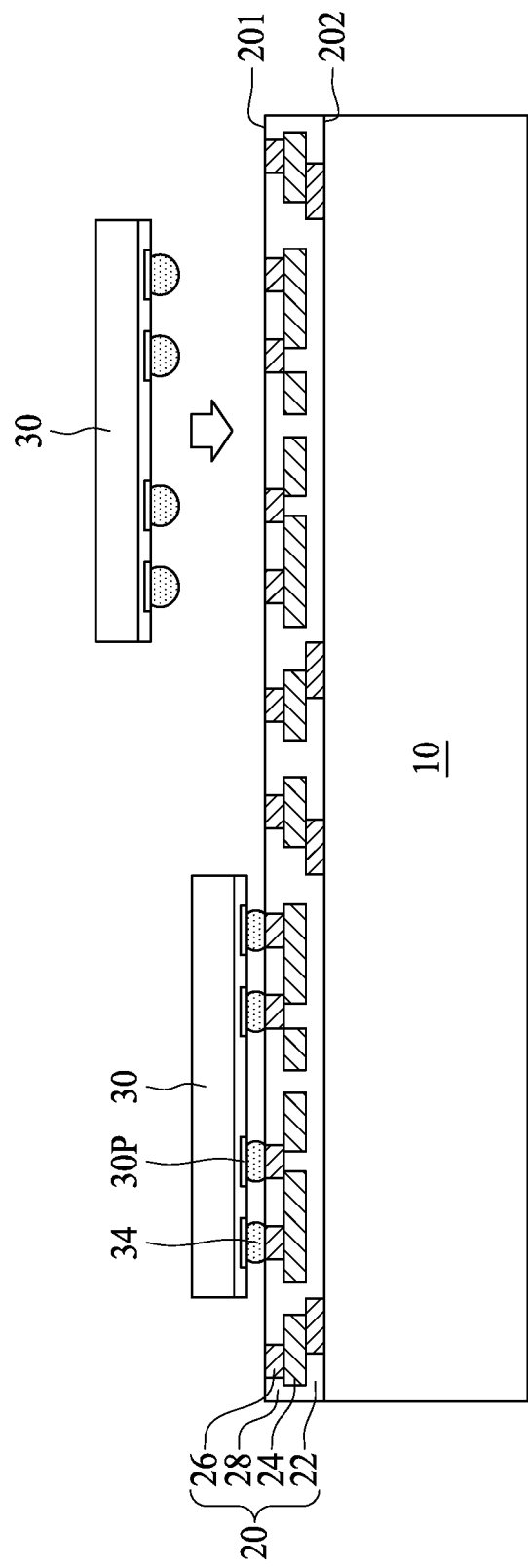

As depicted in FIG. 2B, several first chips 30 are disposed over the first redistribution layer 20. In one or more embodiments, the first chips 30 include active device chips and/or passive device chips. By way of examples, the active device chip may include system on chip (SOC), memory chip such as a DRAM chip, and/or other chips. The passive device chip may include resistors, capacitors, inductors or a combination thereof formed therein. In some embodiments, the passive device chip may be in the form of integrated circuit, but not limited thereto. The first chips 30 may be mounted on the first redistribution layer 20 through surface mount technology (SMT) or other suitable bonding technologies. In some embodiments, each of the first chips 30 includes a plurality of contact pads 30P, and the first chips 30 are electrically connected to the first redistribution layer 20 by bonding the contact pads 30P to the exposed conductive layer 26 of the first redistribution layer 20 through conductive materials 34 such as solder paste, solder bump or other suitable conductive materials. In one or more embodiments, the active device chips and the passive device chips are in electrical communication with each other through the first redistribution layer 20. In some embodiments, the thickness of different first chips 30 may be distinct. For example, the thickness of the active device chip and the passive device chip may be different.

Figure 2C:
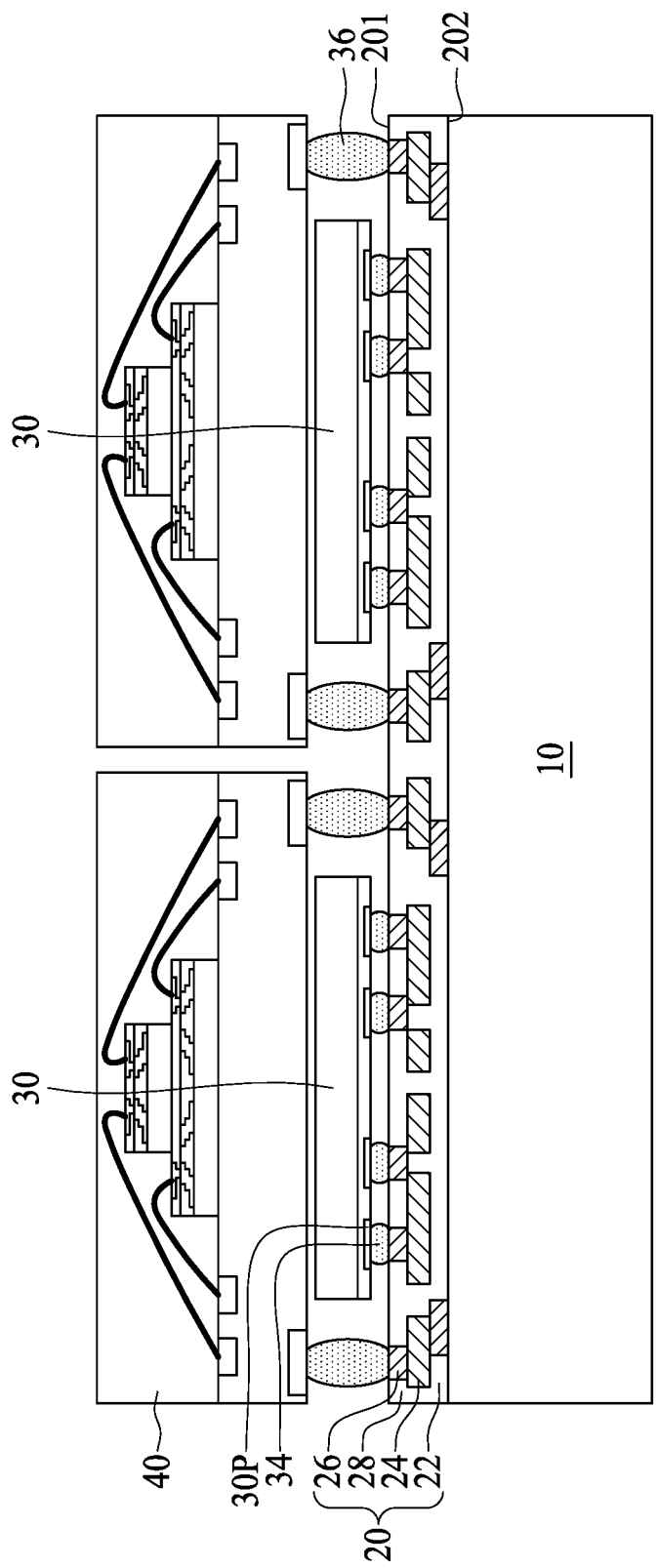

As depicted in FIG. 2C, a plurality of packages 40 are disposed over the first redistribution layer 20 and electrically connected to the first redistribution layer 20 with a plurality of first interconnecting bumps 36. In one or more embodiments, the package 40 is a pre-formed structure including one or more chips which have been packaged with exposed external terminals. In one or more embodiments, the package 40 is a memory device package such as a flash memory device package, but not limited thereto. In one or more embodiments, the first interconnecting bump 36 is a solder ball, wherein one terminal of the solder ball is electrically connected to the external terminal of the package 40, and the other terminal of the solder ball is electrically connected to the exposed conductive layer 26 of the first redistribution layer 20. The first interconnecting bump 36 may include other types of conductor.

Figure 2D:
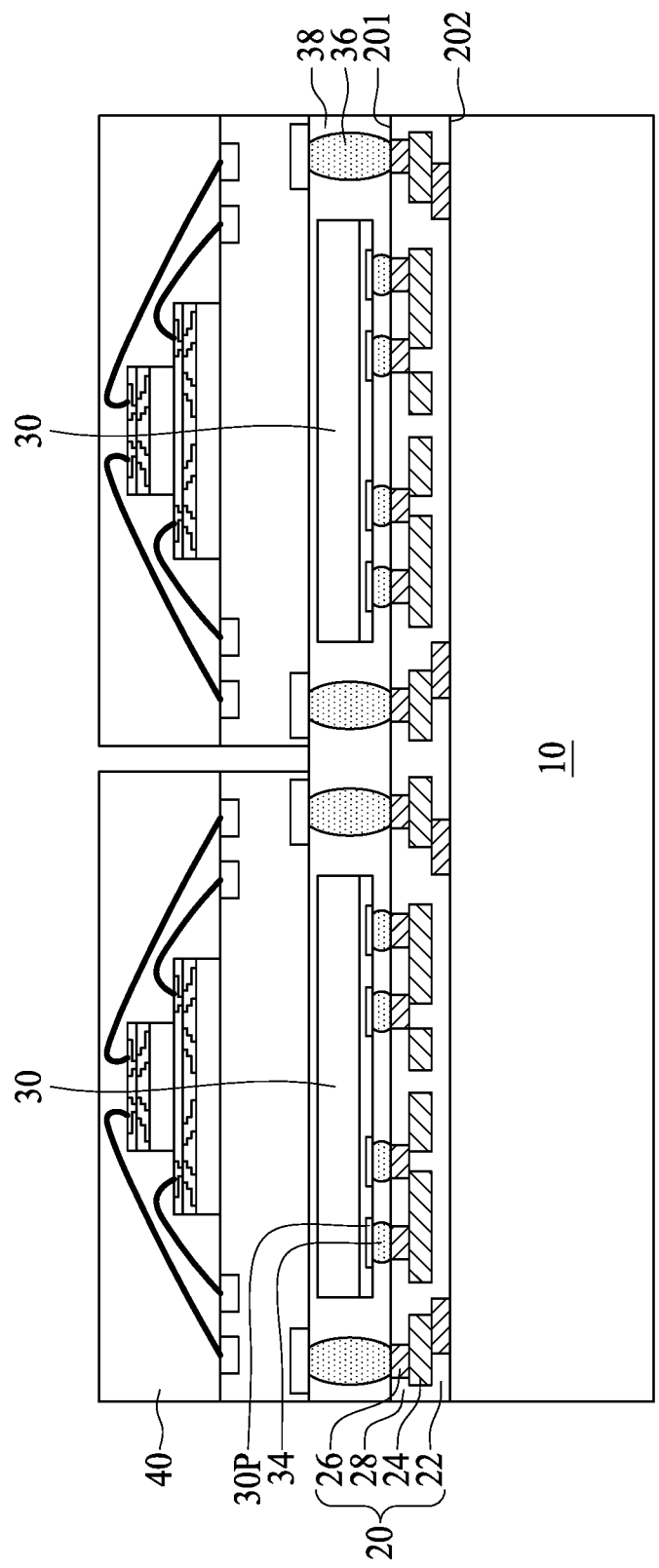

As depicted in FIG. 2D, a first encapsulant 38 is formed between the packages 40 and the first redistribution layer 20. In one or more embodiments, the material of the first encapsulant 38 is a molding compound. In some embodiments, an underfill layer may be formed between the first chips 30 and the first redistribution layer 20. In some embodiments, the first encapsulant 38 is a molding under fill (MUF) layer and thus an additional underfill layer is not required. In one or more embodiments, two opposite terminals of the solder ball are exposed from the first encapsulant 38 to electrically connect to the package 40 and the first redistribution layer 20, respectively. In some embodiments, the first encapsulant 38 covers an upper surface of the first chip 30.

Figure 2E:
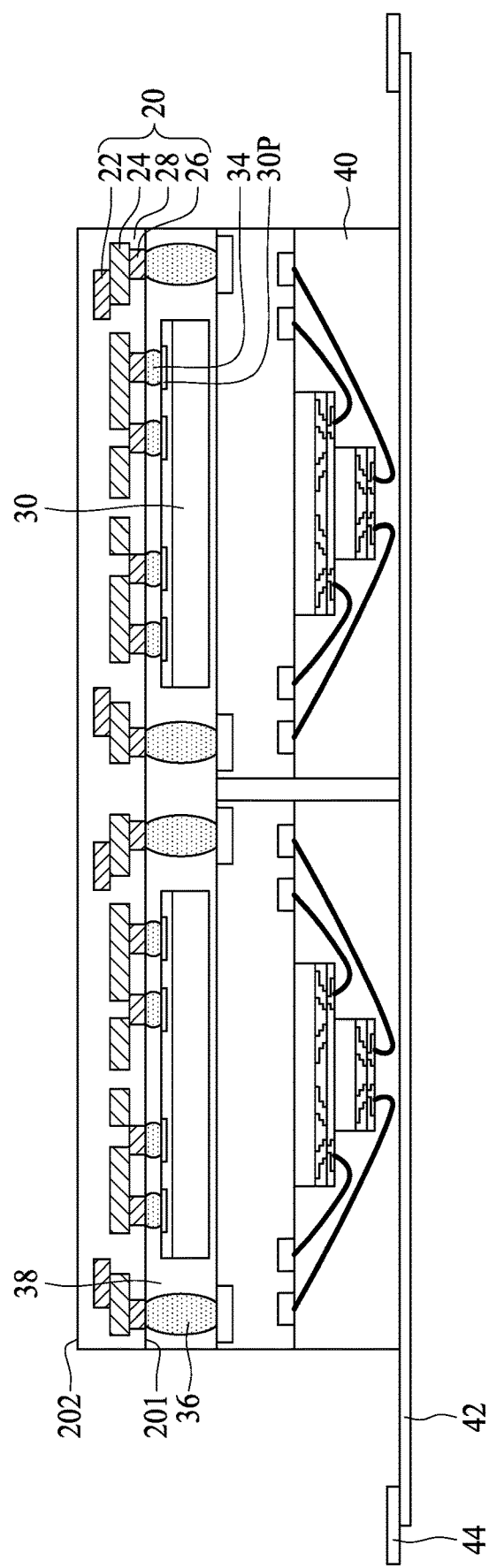

As depicted in FIG. 2E, the packages 40 are attached to a temporary substrate 42. In one or more embodiments, the temporary substrate 42 is a flexible film such as a tape fixed on a frame 44. In some embodiments, the temporary substrate 42 may include other types of substrates such as a rigid substrate. The first carrier substrate 10 is then detached from the first redistribution layer 20.

Figure 2F:
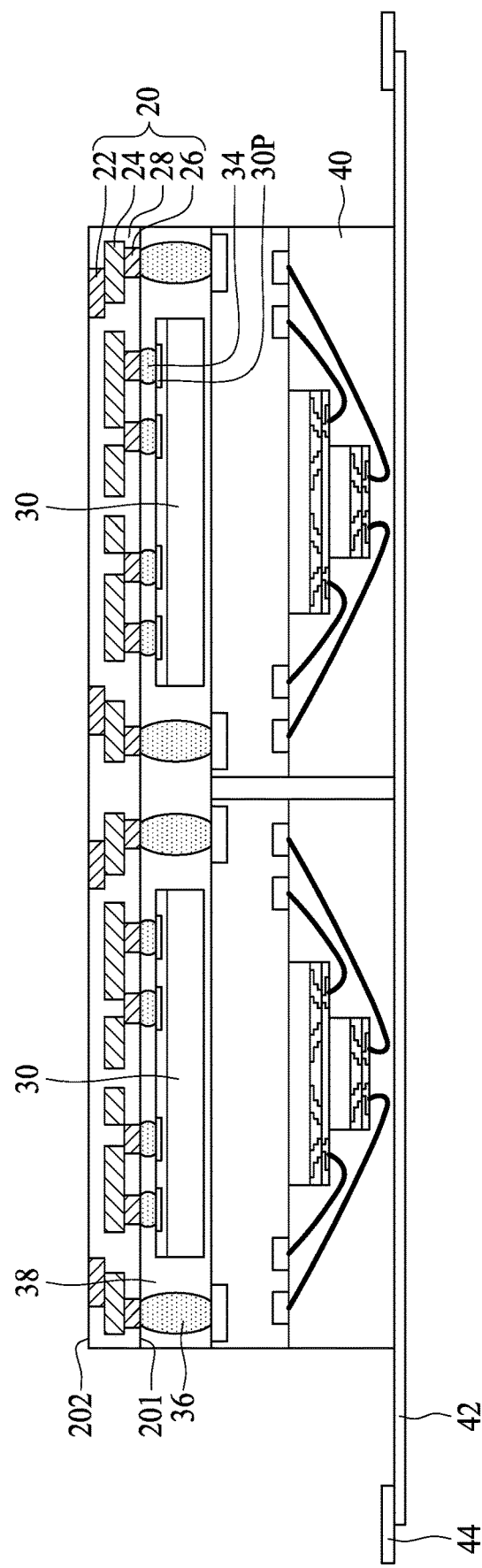

As depicted in FIG. 2F, the first redistribution layer 20 is thinned from the second surface 202 to expose the conductive layer 22 of the first redistribution layer 20. In one or more embodiments, the first redistribution layer 20 is thinned by etching, but not limited. In some embodiments, the first redistribution layer 20 may be thinned by grinding, polishing, or other suitable thinning methods. In some embodiments, in case the conductive layer 22 is exposed from the first redistribution layer 20 in advance, the thinning operation may be omitted. In some embodiments, the exposed conductive layer 22 is configured as contact pads.

Figure 2G:
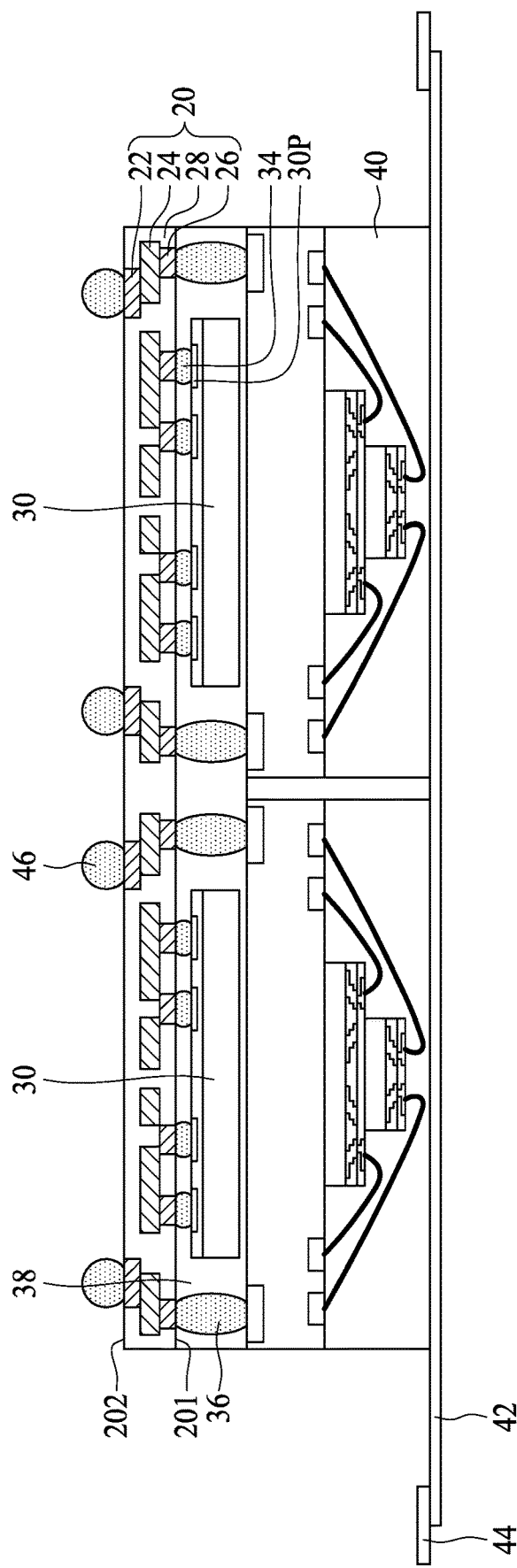
Figure 2H:
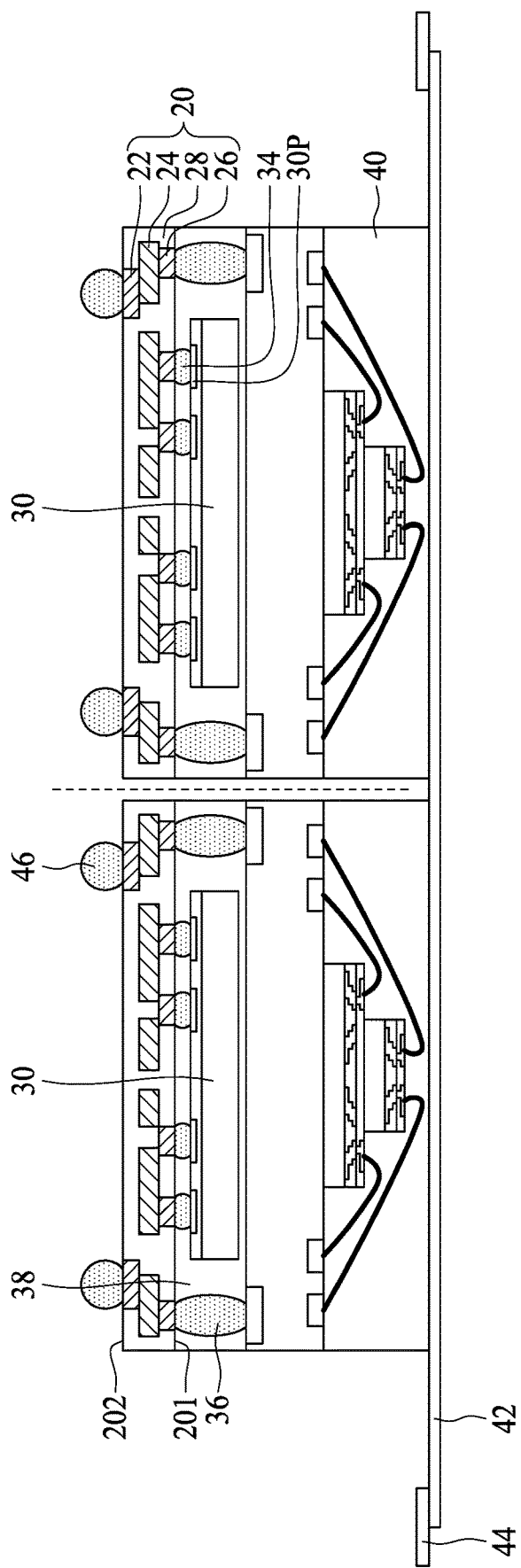

As depicted in FIG. 2G, a plurality of second interconnecting bumps 46 are formed over the first redistribution layer 20 and electrically connected to the exposed conductive layer 22. In one or more embodiments, the second interconnecting bump 46 is a solder ball, but not limited thereto.

As depicted in 2H, the first redistribution layer 20 are divided into pieces, and each piece of the first redistribution layer 20 is connected to the corresponding package 40. In one or more embodiments, the first redistribution layer 20 may be divided by sawing or other suitable cutting methods.

Figure 2I:
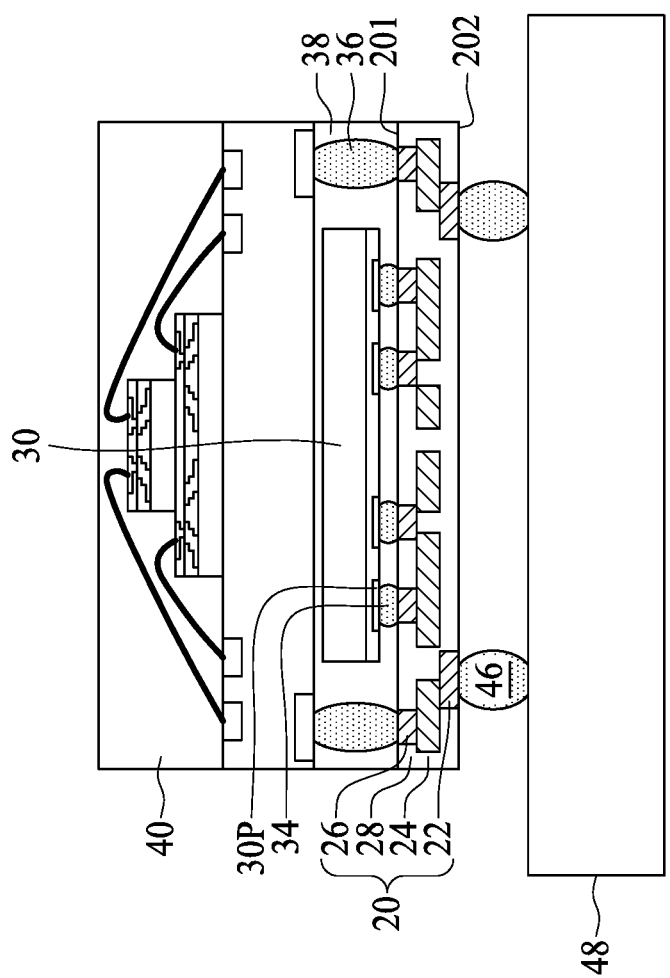

As depicted in FIG. 2I, the package 40 connected to the corresponding piece of the first redistribution layer 20 is detached from the temporary substrate 42 to form a semiconductor package structure 1. In one or more embodiments, the second interconnecting bumps 46 are configured as external connectors, and electrically connected to a circuit board 48 disposed over the second surface 202 of the first redistribution layer 20 such that the circuit board 48 is electrically connected to the first redistribution layer 20 with the second interconnecting bumps 46. In one or more embodiments, the semiconductor package structure 1 may be stacked on another package structure.

The first chips 30 are embedded in the first encapsulant 38, and thus the overall thickness is reduced. The first interconnecting bumps 36 are formed in the first encapsulant 38, and prior to formation of the first encapsulant 38, and thus no through via structure is required to electrically connect the package 40 and the first redistribution layer 20. Consequently, the manufacturing cost and complexity are reduced. In addition, the first chips 30 are prevented from being thermally damaged due to high temperature in formation of through via structure. Also, the first interconnecting bumps 36 are formed by low temperature operation, and the semiconductor package structure 1 requires one molding operation to form the first encapsulant 38. Accordingly, warpage issue is alleviated.

Figure 3:
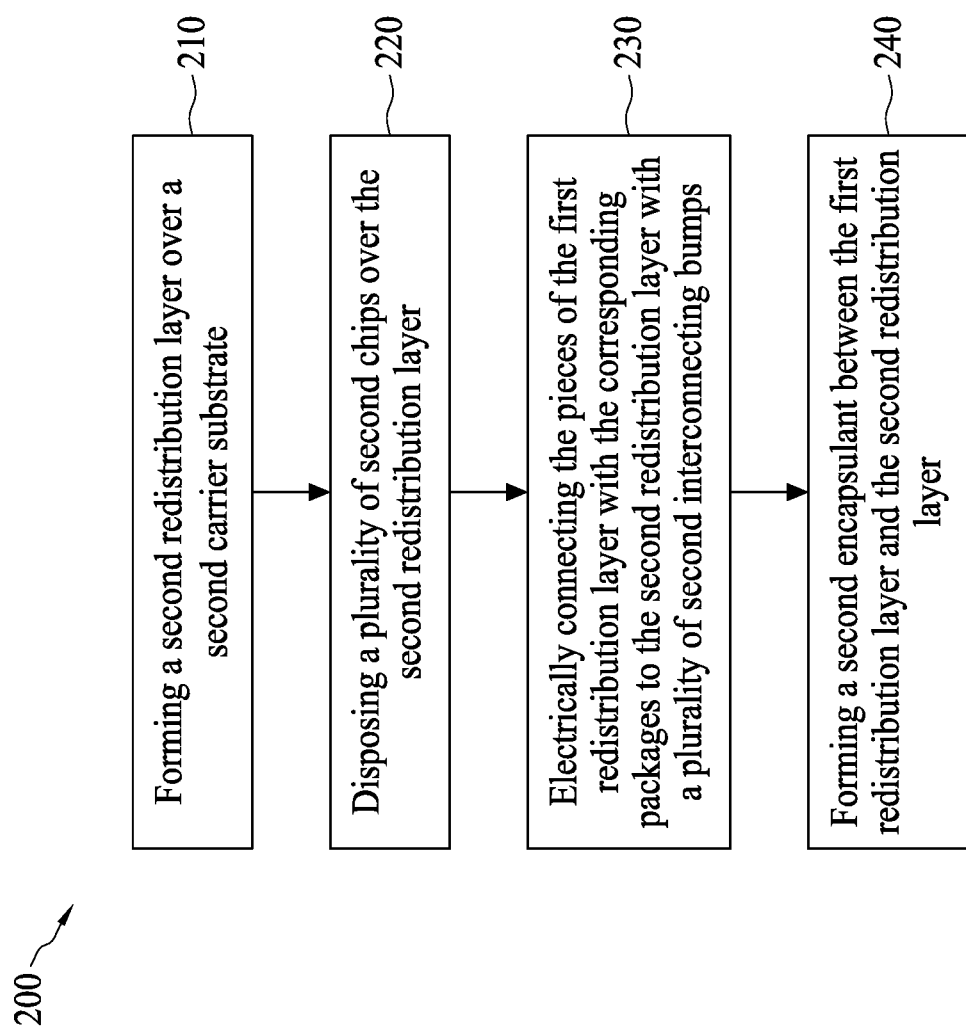
FIG. 3 is a flow chart illustrating a method for manufacturing semiconductor package structure according to various aspects of the present disclosure.

FIG. 3 is a flow chart illustrating a method for manufacturing a semiconductor package structure according to various aspects of the present disclosure. In one or more embodiments, the method 200 is followed with operation 140 of the method 100 in FIG. 1. The method 200 proceeds with operation 210 in which a second redistribution layer is formed over a second carrier substrate. The method 200 continues with operation 220 in which a plurality of second chip are disposed over the second redistribution layer. The method 200 proceeds with operation 230 in which each piece of the first redistribution layer with the corresponding package is electrically connected to the second redistribution layer with a plurality of second interconnecting bumps. The method 200 proceeds with operation 240 in which a second encapsulant is formed between the first redistribution layer and the second redistribution layer.

The method 200 is merely an example, and is not intended to limit the present disclosure beyond what is explicitly recited in the claims. Additional operations can be provided before, during, and after the method 200, and some operations described can be replaced, eliminated, or moved around for additional embodiments of the method.

Figure 4A:
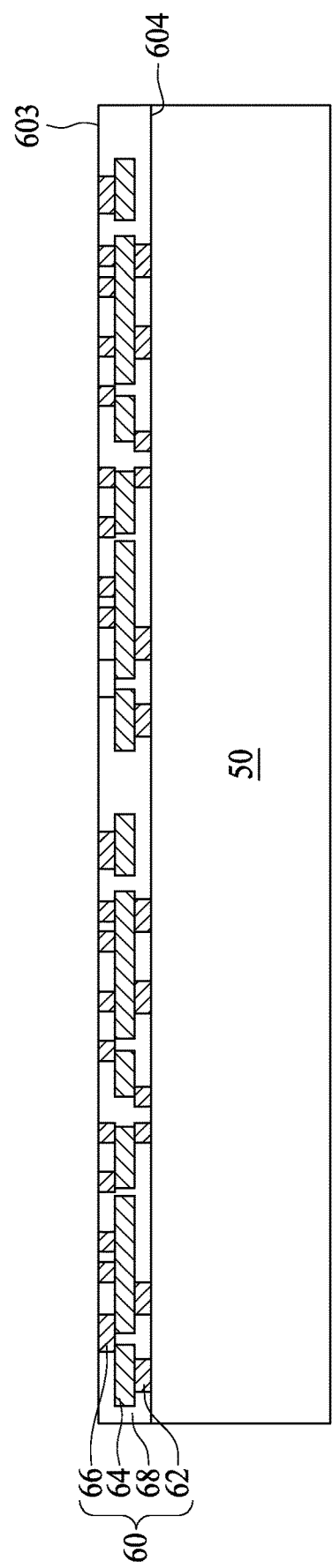
FIGS. 4A, 4B, 4C, 4D, 4E and 4F are cross-sectional views at one of various operations of manufacturing semiconductor package structure according to one or more embodiments of the present disclosure.
Figure 4B:
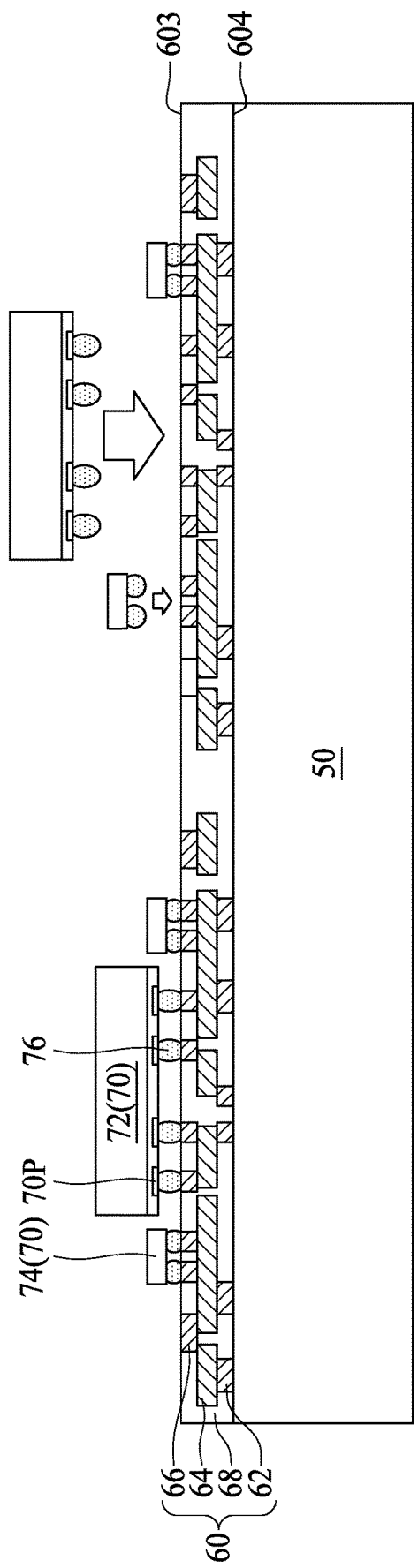

FIGS. 4A, 4B. 4C, 4D, 4E and 4F are cross-sectional views at one of various operations of manufacturing semiconductor package structure according to one or more embodiments of the present disclosure. As depicted in FIG. 4A, a second redistribution layer 60 is formed over a second carrier substrate 50. The second carrier substrate 50 is configured as a temporary carrier for forming the second redistribution layer 60, and will be removed subsequently. In one or more embodiments, the second carrier substrate 50 is an insulative substrate such as a glass substrate. The second carrier substrate 50 may include a semiconductor substrate such as a silicon substrate, a conductive substrate such as a metal substrate, or other suitable substrate. The second redistribution layer 60 has a third surface 603 and a fourth surface 604 opposite to each other. In some embodiments, the fourth surface 604 of the second redistribution layer 60 faces the second carrier substrate 50. The second redistribution layer 60 is formed by at least one conductive layer and at least one insulation layer, and configured to electrically communicate with two or more devices. In one or more embodiments, the second redistribution layer 60 includes three conductive layers 62, 64, 66 and at least one insulation layer 68 surrounding the conductive layers 62, 64, 66. In some embodiments, the conductive layers 62, 64, 66 include different patterns, and some of the portions are electrically connected. In some embodiments, the conductive layer 62 is exposed from the fourth surface 604, and the conductive layer 66 is exposed from the third surface 603. In some embodiments, the second redistribution layer 60 is formed by performing several deposition operations, photolithography operations and etching operations. In some embodiments, the material of the conductive layers 62, 64, 66 includes metal such as copper, titanium, the like, or a combination thereof. The material of the at least one insulation layer 64 may include inorganic and/or organic insulation material.

As depicted in FIG. 4B, several second chips 70 are disposed over the second redistribution layer 60. In one or more embodiments, the second chips 70 include active device chips 72 and/or passive device chips 74. By way of example, the active device chip 72 may include system on chip (SOC). The passive device chip 74 may include resistors, capacitors, inductors or a combination thereof formed therein. In some embodiments, the passive device chip 74 may be in the form of integrated circuit, but not limited thereto. The second chips 70 may be mounted on the second redistribution layer 60 through surface mount technology (SNIT) or other suitable bonding technologies. In some embodiments, each of the second chips 70 includes a plurality of contact pads 70P, and the second chips 70 are electrically connected to the second redistribution layer 60 by bonding the contact pads 70P to a portion of the exposed conductive layer 66 of the second redistribution layer 60 through conductive materials 76 such as solder paste, solder bump or other suitable conductive material s. In one or more embodiments, the active device chips 72 and the passive device chips 74 are in electrical communication with each other through the second redistribution layer 60. In some embodiments, the thickness of different second chips 70 may be distinct. For example, the thickness of the active device chip 72 and the passive device chip 74 are different.

Figure 4C:
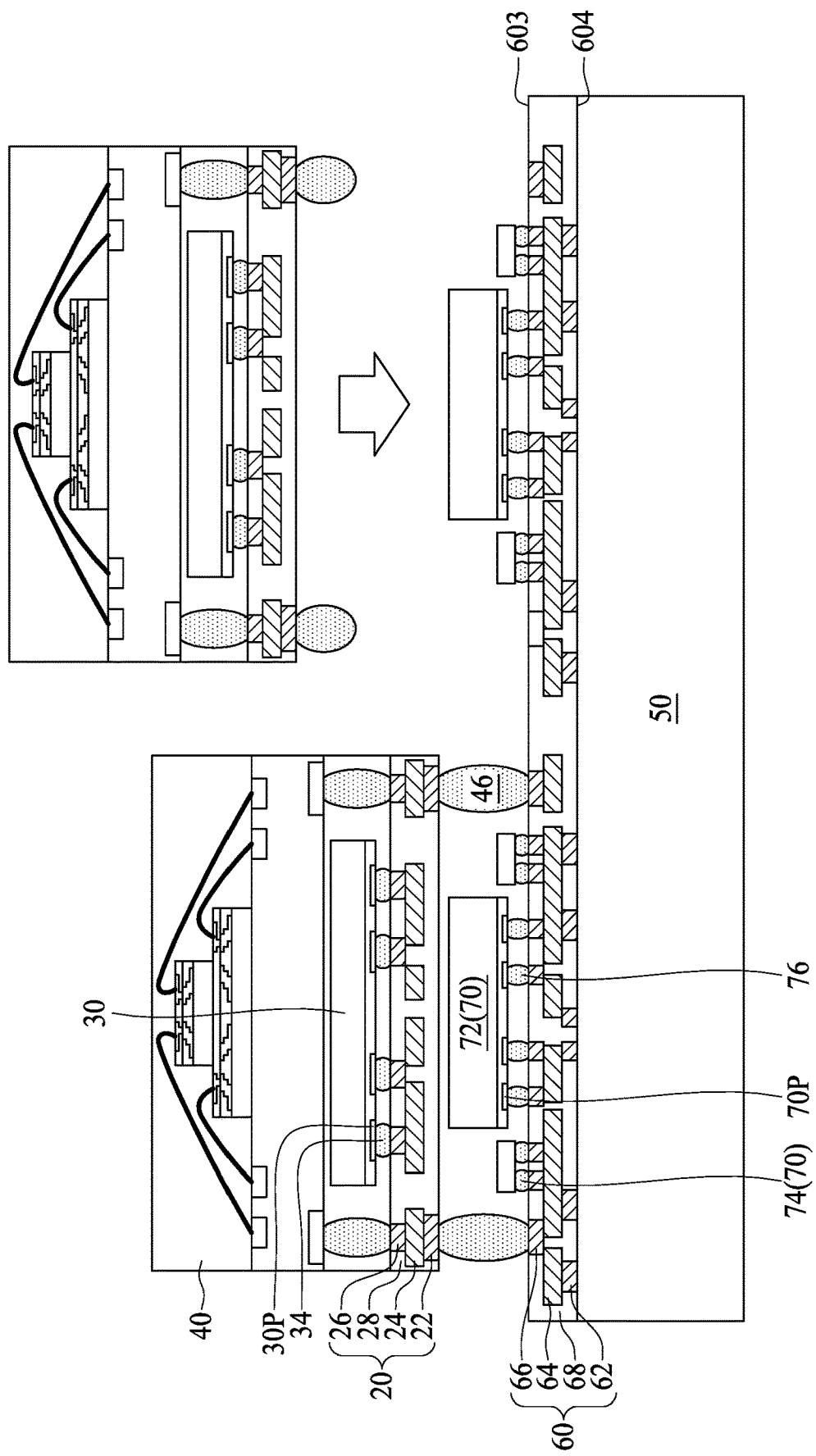

As depicted in FIG. 4C, the semiconductor package structure including the piece of the first redistribution layer 20 connected to the corresponding package 40 formed by the method illustrated in FIGS. 2A-2I are disposed on the second redistribution layer 60, and electrically connected to the second redistribution layer 60 with the plurality of second interconnecting bumps 46. In one or more embodiments, the second interconnecting bump 46 is a solder ball, wherein one terminal of the solder ball is electrically connected to the first redistribution layer 20, and the other terminal of the solder ball is electrically connected to another portion of the exposed conductive layer 66 of the second redistribution layer 60. The second interconnecting bump 46 may include other types of conductor.

Figure 4D:
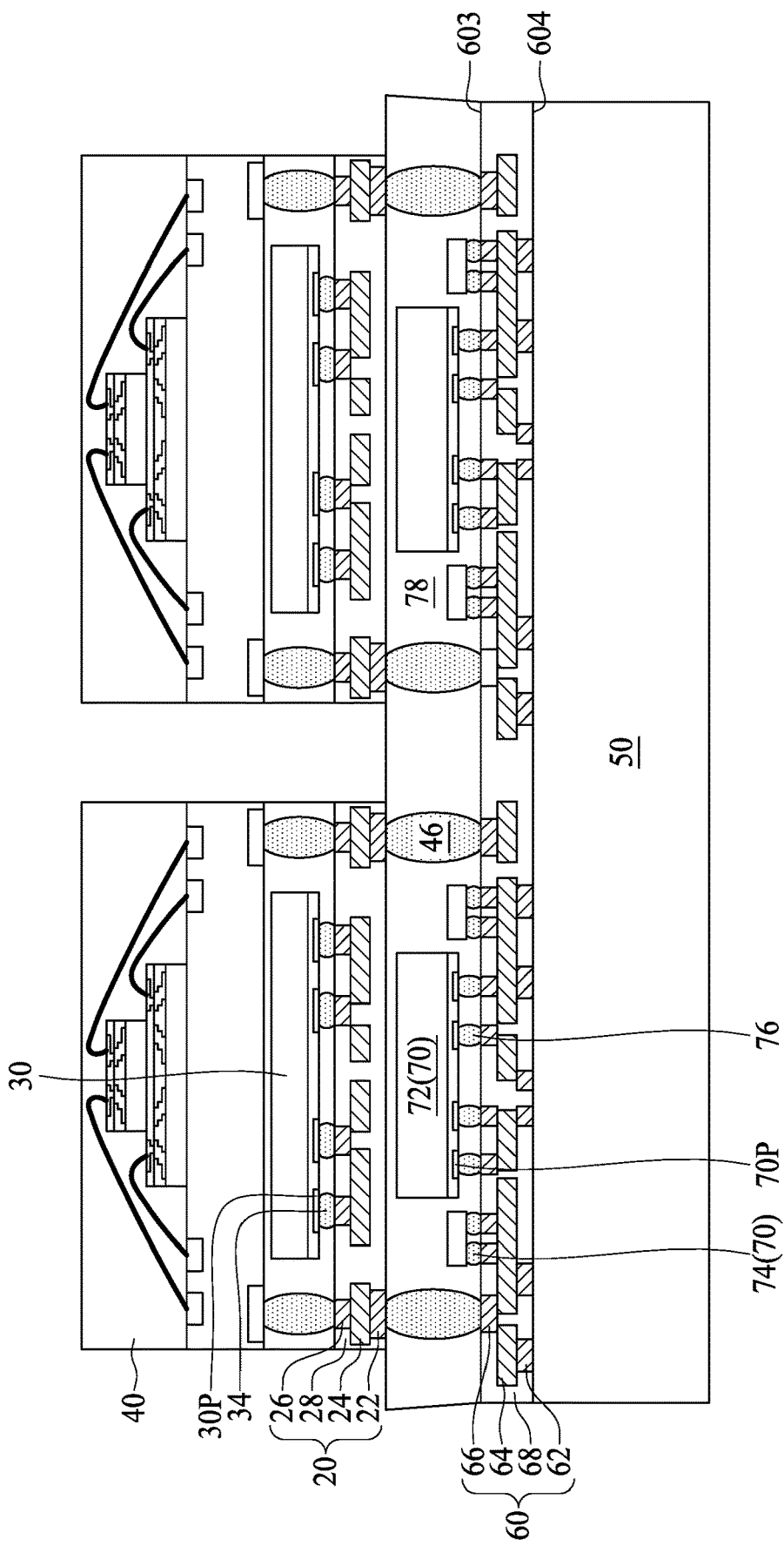

As depicted in FIG. 4D, a second encapsulant 78 is disposed between the first redistribution layer 20 and the second redistribution layer 60. In one or more embodiments, the second encapsulant 78 encloses the second chip 70 and surrounds lateral walls of the second interconnecting bumps 46. In one or more embodiments, the material of the second encapsulant 78 is a molding compound. In some embodiments, an underfill layer may be formed between the second chips 70 and the second redistribution layer 60. In some embodiments, the second encapsulant 78 is a molding under fill (Main layer and thus an additional underfill layer is not required. In one or more embodiments, two opposite terminals of the solder ball are exposed from the second encapsulant 78 to electrically connect to the first redistribution layer 20 and the second redistribution layer 60, respectively.

Figure 4E:
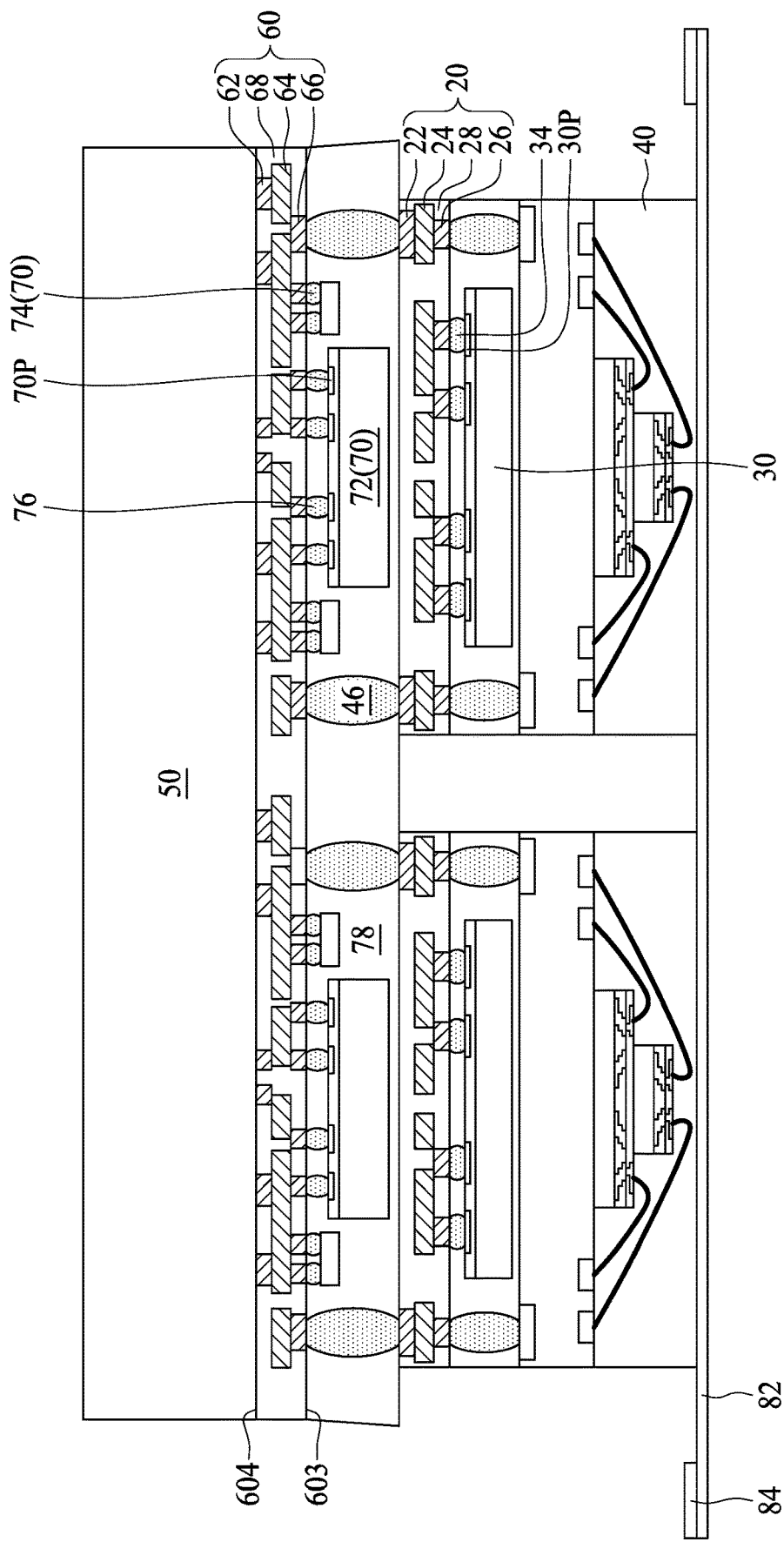

As depicted in FIG. 4E, the packages 40 are attached to another temporary substrate 82. In one or more embodiments, the temporary substrate 82 is a flexible film such as a tape fixed on a frame 84. In some embodiments, the temporary substrate 82 may include other types of substrates such as a rigid substrate. The second carrier substrate 50 is then detached from the second redistribution layer 60. In some embodiments, the second redistribution layer 60 is thinned from the fourth surface 604 to expose the conductive layer 62 of the second redistribution layer 60. In one or more embodiments, the second redistribution layer 60 is thinned by etching, but not limited. In some embodiments, the second redistribution layer 60 may be thinned by grinding, polishing, or other suitable thinning methods. In some embodiments, in case the conductive layer 62 is exposed from the second redistribution layer 60 in advance, the thinning operation may be omitted. In some embodiments, the exposed conductive layer 62 is configured as contact pads.

Figure 4F:
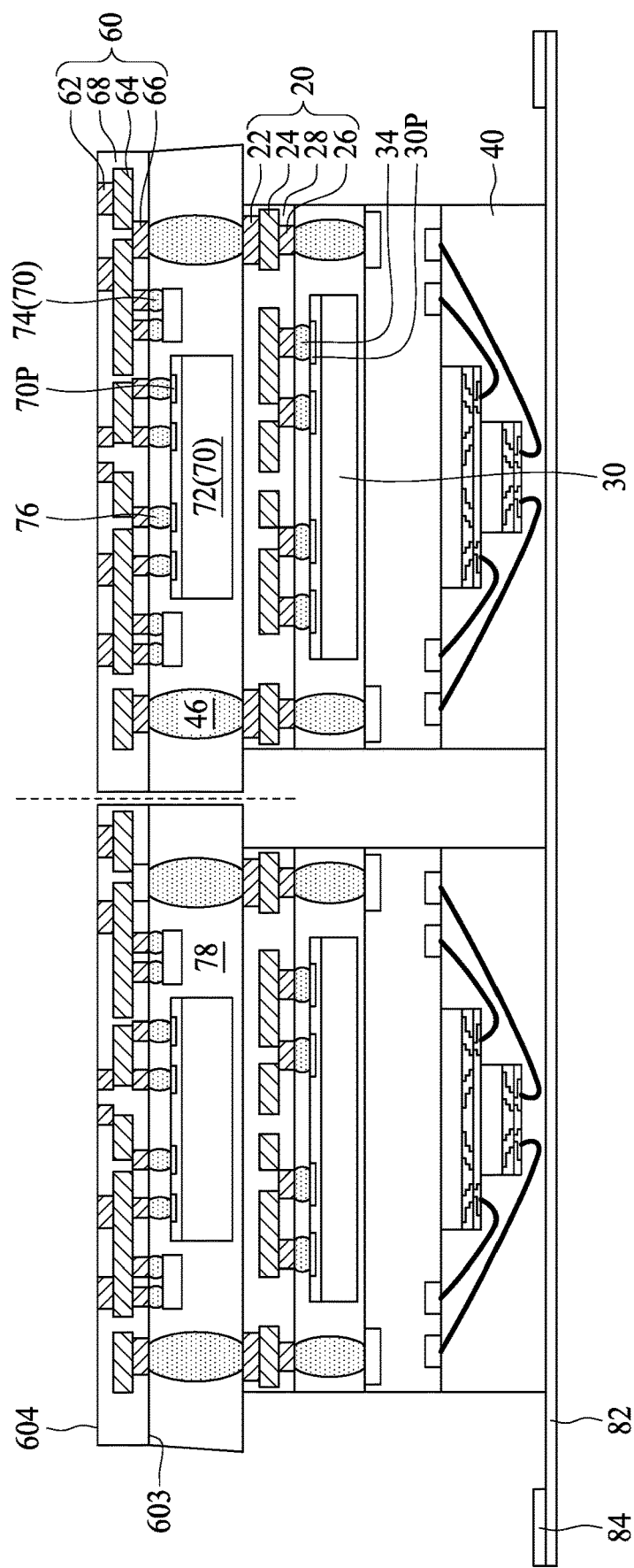

As depicted in FIG. 4F, several external connectors 86 are formed over the fourth surface 604 of the second redistribution layer 60 and electrically connected to a portion of the exposed conductive layer 62 of the second redistribution layer 60. In one or more embodiments, the external connectors 86 are arranged as a ball grid array (BGA), but not limited thereto. In one or more embodiments, several third chips 88 may be disposed over the fourth surface 604 of the second redistribution layer 60 and electrically connected to another portion of the exposed conductive layer 62 of the second redistribution layer 60. In some embodiments, the third chip 88 is a passive device chip, which may include resistors, capacitors, inductors or a combination thereof formed therein. The third chips 88 are in electrical communication with the second chips 70 through the second redistribution layer 60 and in electrical communication with the first chips 30 through the first redistribution layer 20. The second redistribution layer 60 is sawed by any suitable cutting methods. Subsequently, the temporary substrate 82 is removed to form semiconductor package structures 2.

The first chips 30 and the second chips 70 are embedded in the first encapsulant 38 and the second encapsulant 78, and thus the overall thickness is reduced. The first interconnecting bumps 36 are formed in the first encapsulant 38, and the second interconnecting bumps 46 are formed in the second encapsulant 78, and thus no through via structure is required. Consequently, the manufacturing cost and complexity are reduced. In addition, the first chips 30 and the second chips 70 are prevented from being thermally damaged due to high temperature in formation of through via structure. Also, the first interconnecting bumps 36 and the second interconnecting bumps 46 are formed by low temperature operation, and the semiconductor package structure 2 requires two molding operations to form the first encapsulant 38 and the second encapsulant 78. Accordingly, warpage issue is alleviated.

The present disclosure is not limited to the above-mentioned embodiments, and may have other different embodiments. To simplify the description and for the convenience of comparison between each of the embodiments of the present disclosure, the identical components in each of the following embodiments are marked with identical numerals. For making it easier to compare the difference between the embodiments, the following description will detail the dissimilarities among different embodiments and the identical features will not be redundantly described.

Figure 5:
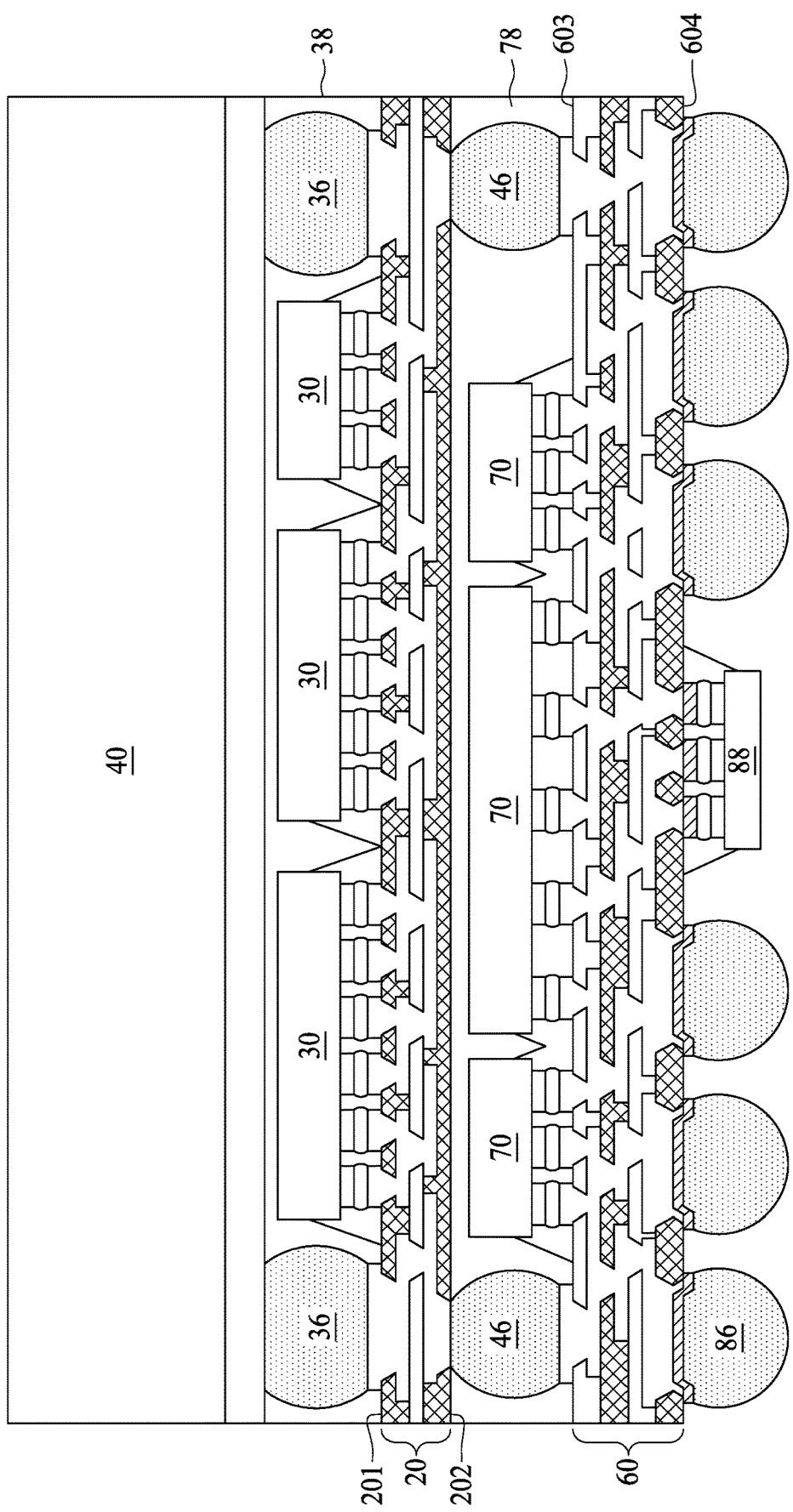
FIG. 5 is a schematic diagram illustrating a semiconductor package structure in accordance with some embodiments of the present disclosure.

FIG. 5 is a schematic diagram illustrating a semiconductor package structure 3 in accordance with some embodiments of the present disclosure. As shown in FIG. 5, the semiconductor package structure 3 includes a first redistribution layer (RDL) 20, first chips 30, first interconnecting bumps 36, first encapsulant 38, a second RDL 60, second chips 70, second interconnecting bumps 46, and second encapsulant 78. The first RDL 20 has a first surface 201 and a second surface 202 opposite to each other. The first chip 30 are disposed over the first RDL 20 with a plurality of contact pads 30P facing the first surface 201 and electrically connected to the first RDL 20. The first interconnecting bumps 36 are disposed over the first surface 201 and electrically connected to the first RDL 20. The first encapsulant 38 is disposed over the first surface 201 of the first RDL 20. The first encapsulant 38 encloses the first chips 30 and surrounds lateral walls of the first interconnecting bumps 36. The second RDL 60 is over the second surface 202 of the first RDL 20. The second RDL 60 has a third surface 603 and a fourth surface 604 opposite to each other, and the third surface 603 faces the second surface 202. The second chips 70 are disposed over the second RDL 60 with a plurality of contact pads 70P facing the third surface 603. The second interconnecting bumps 46 are disposed over the third surface 603 and electrically connected to the second RDL 60. The second encapsulant 78 is disposed between the first RDL 20 and the second RDL, 60. The second encapsulant 78 encloses the second chip 70 and surrounds lateral walls of the second interconnecting bumps 46. In one or more embodiments, the semiconductor package structure 3 further includes a package (not shown) disposed over the first encapsulant 38 and electrically connected to the first RDL 20 through the first interconnecting bumps 36. In one or more embodiments, the height of the second interconnecting bumps 46 is higher than the height of the second chip 70. In one or more embodiments, the semiconductor package structure 3 further includes a circuit board (not shown) disposed over the fourth surface 604 of the second RDL 60, and external connectors 86 disposed between the fourth surface 604 and the circuit board to electrically connect the second RDL 60 with the circuit board.

Figure 6:
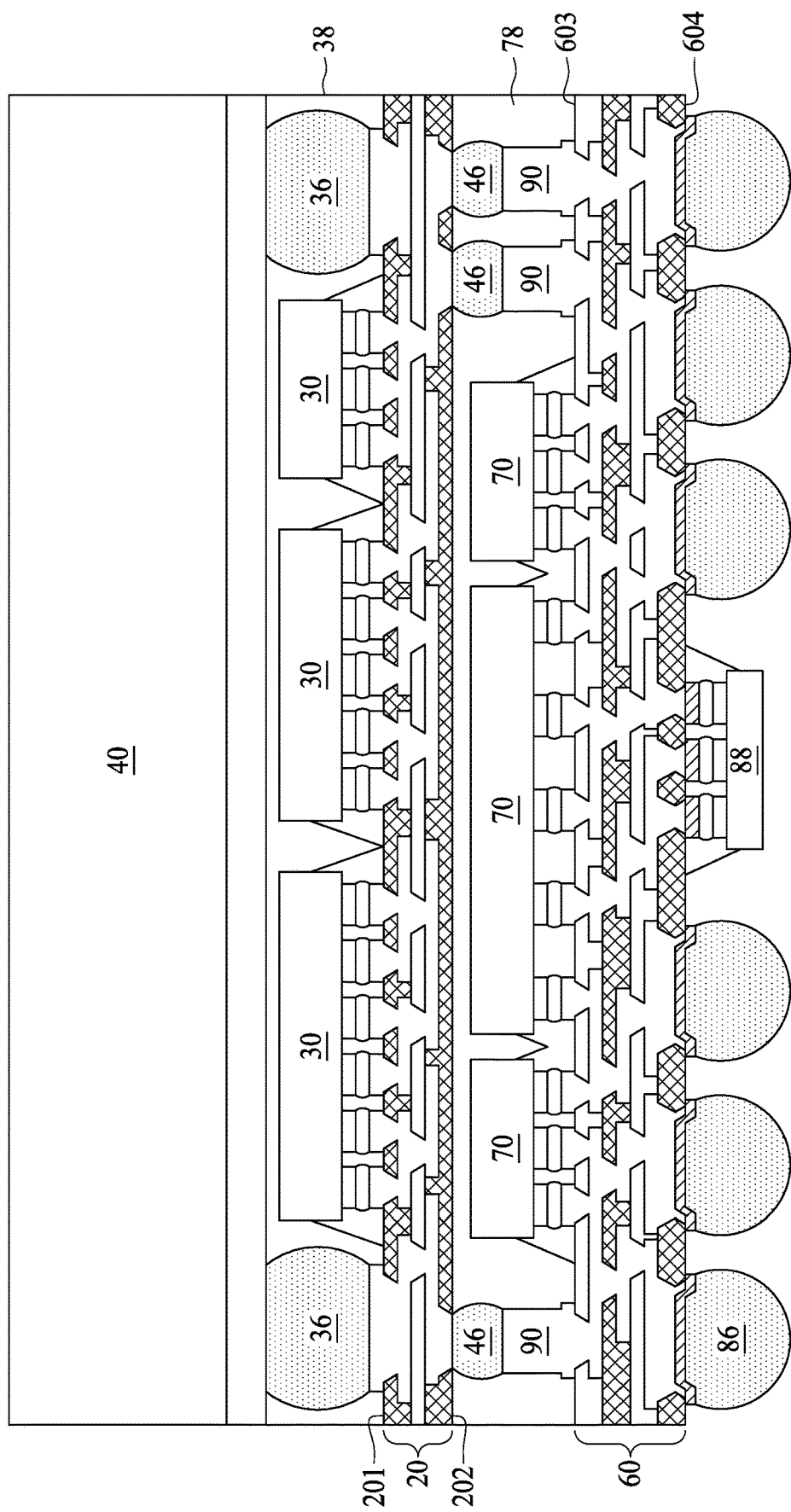
FIG. 6 is a schematic diagram illustrating a semiconductor package structure in accordance with some embodiments of the present disclosure.

FIG. 6 is a schematic diagram illustrating a semiconductor package structure 4 in accordance with some embodiments of the present disclosure. As shown in FIG. 6, one of the differences between the semiconductor package structure 4 and the semiconductor package structure 3 in FIG. 5 is that the semiconductor package structure 4 further includes conductive posts 90 disposed in the second encapsulant 78. In some embodiments, each of the second interconnecting bumps 46 is a solder paste, where one terminal of the conductive post 90 is connected to the second RDL 60, and the other terminal of the conductive post 90 is connected to the corresponding second interconnecting bump 46. The fabrication and the materials of the conductive posts 90 and the second interconnecting bumps 46 are different. In one or more embodiments, the conductive posts 90 are formed by deposition, photolithography and etching operations, and thus the pitch between adjacent conductive posts 90 can be reduced. Accordingly, the conductive post 90 in association with the solder paste is able to fulfill fine-pitch joint between the first RDL 20 and the second RDL 60. The height ratio between the conductive posts 90 and the second interconnecting bumps 46 may be modified based on different considerations. In some embodiments, the upper surface of the conductive post 90 is substantially leveled with the upper surface of the second chip 70. In some embodiments, the upper surface of the conductive post 90 is lower than the upper surface of the second chip 70. In one or more embodiments, the overall height of the conductive posts 90 and the second interconnecting bumps 46 is higher than the height of the second chip 70.

In the present disclosure, the chips are embedded in the encapsulant, and thus the overall thickness of the semiconductor package structure is reduced. The system performance is improved due to reduction of electrical communication path among chips. The chips configured for providing different functionalities such as active device chip and passive device chip may have different thicknesses, and thus the flexibility in selecting chips is increased. No through via structure is required, and therefore the manufacturing cost and complexity are reduced. The chips are prevented from being thermally damaged due to high temperature in formation of through via structure. Compared to through via structure, the interconnecting bumps are formed of low melting point material, which can be formed by low temperature operation. Thus, thermal budget is reduced. Also, the semiconductor package structure requires fewer molding operations to form the encapsulant(s). Accordingly, warpage issue is alleviated.

In one exemplary aspect, a semiconductor package structure includes a first redistribution layer (RDL), a first chip, a second chip and a plurality of external connectors. The first redistribution layer has a first surface and a second surface opposite to each other. The first chip is disposed over the first surface of the first redistribution layer with a plurality of contact pads facing the first surface and electrically connected to the first redistribution layer. The second chip is disposed over the second surface of the first redistribution layer with a plurality of contact pads facing the second surface and electrically connected to the first redistribution layer. The plurality of external connectors are disposed over and electrically connected to the second surface of the first redistribution layer.

In another exemplary aspect, a semiconductor package structure includes a first redistribution layer, a second redistribution layer and an interconnecting structure. The first redistribution layer has a first surface and a second surface opposite to each other. The second redistribution layer is disposed over the first surface of the first redistribution layer, wherein the second redistribution layer has a third surface and a fourth surface opposite to each other, and the third surface facing the first surface. The interconnecting structure is disposed between and electrically connected to the first redistribution layer and the second redistribution layer, wherein the interconnecting structure comprises a conductive post and a conductive bump stacked to each other.

In yet another aspect, a semiconductor package structure includes a first redistribution layer, a second redistribution layer, a first chip and an interconnecting structure. The first redistribution layer has a first surface and a second surface opposite to each other. The second redistribution layer is disposed over the first surface of the first redistribution layer, wherein the second redistribution layer has a third surface and a fourth surface opposite to each other, and the third surface facing the first surface. The first chip is disposed between the first redistribution layer and the second redistribution layer. The interconnecting structure is disposed between and electrically connected to the first redistribution layer and the second redistribution layer, wherein the interconnecting structure comprises a conductive post and a conductive bump stacked to each other, and the conductive post and the conductive bump comprise different materials.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor package structure, comprising:
   forming a first redistribution layer over a first carrier substrate;
   disposing a plurality of first chips over the first redistribution layer;
   electrically connecting a package to the first redistribution layer with a plurality of first interconnecting structures;
   forming a first encapsulant between the package and the first redistribution layer subsequent to electrically connecting the package to the first redistribution layer with the plurality of first interconnecting structures;
   forming a second redistribution layer over a second carrier substrate;
   disposing a plurality of second chips over the second redistribution layer; and
   electrically connecting the first redistribution layer to the second redistribution layer with a plurality of second interconnecting structures; and
   forming a second encapsulant between the first redistribution layer and the second redistribution layer.

2. The method of claim 1, further comprising forming the first encapsulant to surround sidewalls of the first interconnecting structures.

3. The method of claim 2, wherein at least one terminal of each of the first interconnecting structures is exposed from the first encapsulant.

4. The method of claim 1, wherein the first interconnecting structures comprise conductive bumps.

5. The method of claim 1, further comprising:
   attaching the package to a temporary substrate.

6. The method of claim 1, wherein at least one terminal of each of the second interconnecting structures is exposed from the second encapsulant.

7. The method of claim 1, wherein the second interconnecting structures comprise conductive bumps.

8. The method of claim 1, wherein each of the second interconnecting structures comprises a stack of a conductive bump and a conductive post, one terminal of each of the conductive posts is connected to the second redistribution layer, and the other terminal of each of the conductive posts is connected to the corresponding conductive bump.

9. A method for manufacturing a semiconductor package structure, comprising:

forming a first redistribution layer having a first surface and a second surface opposite to each other;

disposing a first chip over the first redistribution layer with a plurality of contact pads facing the first surface and electrically connected to the first redistribution layer;

electrically connecting a package to the first redistribution layer with a plurality of interconnecting bumps;

forming a second redistribution layer having a third surface and a fourth surface opposite to each other;

disposing a second chip over the third surface with a plurality of contact pads facing the third surface and electrically connected to the second redistribution layer;

electrically connecting the second redistribution layer to the first redistribution layer with a plurality of first interconnecting structures; and forming an encapsulant between the first redistribution layer and the second redistribution layer, wherein each of the first interconnecting structures comprises a stack of a conductive bump and a conductive post, the encapsulant laterally surrounds a sidewall of each of the conductive bumps and a sidewall of each of the conductive posts.

10. The method of claim 9, further comprising disposing a plurality of external connectors over the fourth surface of the second redistribution layer.

11. The method of claim 9, wherein one terminal of each of the conductive posts is connected to the second redistribution layer, and the other terminal of each of the conductive posts is connected to the corresponding conductive bump.

12. The method of claim 9, further comprising disposing a third chip over the fourth surface of the second redistribution layer with a plurality of contact pads facing the fourth surface and electrically connected to the second redistribution layer.

13. The method of claim 9, wherein a first terminal of each of the conductive bumps is exposed from the encapsulant.

14. The method of claim 13, wherein the first terminal of each of the conductive bumps directly contacts the second surface of the first redistribution layer.

15. The method of claim 9, wherein the encapsulant encloses the second chip covers an upper surface of the second chip, and directly contacts the second surface of the first redistribution layer.

16. The method of claim 9, wherein the interconnecting bumps are formed between the package and the first surface of the first redistribution layer.

17. The method of claim 9, wherein one terminal of each of the interconnecting bumps is electrically connected to an external terminal of the package, and the other terminal of each of the interconnecting bumps is electrically connected to an exposed conductive layer of the first redistribution layer.

18. The method of claim 9, wherein the interconnecting bumps laterally surround the first chip.

19. A method for manufacturing a semiconductor package structure, comprising:

forming a first redistribution layer over a first carrier substrate;

disposing a plurality of first chips over the first redistribution layer;

forming a plurality of first interconnecting structures each comprising a conductive bump and a conductive post stacked on the conductive bump over the first redistribution layer;

electrically connecting a plurality of packages to the first redistribution layer through the plurality of first interconnecting structures;

forming an encapsulant between the packages and the first redistribution layer;

dividing the first redistribution layer into pieces, wherein each piece of the first redistribution layer is connected to the corresponding package;

forming a second redistribution layer over a second carrier substrate;

disposing a plurality of second chips over the second redistribution layer; and electrically connecting the pieces of the first redistribution layer with the corresponding packages to the second redistribution layer with a plurality of second interconnecting structures.

20. The method of claim 19, wherein the conductive posts are formed by deposition, photolithography and etching operations.

* * * * *